United States Patent [19]

Young

[11] Patent Number: 4,796,230
[45] Date of Patent: Jan. 3, 1989

[54] FOLDED-CASCODE CONFIGURED DIFFERENTIAL CURRENT STEERING COLUMN DECODER CIRCUIT

[75] Inventor: Ian A. Young, Portland, Oreg.

[73] Assignee: Intel Corporation, Santa Clara, Calif.

[21] Appl. No.: 65,930

[22] Filed: Jun. 24, 1987

[51] Int. Cl.$^4$ .............................................. G11C 7/00
[52] U.S. Cl. .................................... 365/189; 365/207; 307/449
[58] Field of Search ............... 365/189, 230, 207, 208; 307/463, 449; 330/253

[56] References Cited

U.S. PATENT DOCUMENTS

| 4,096,584 | 6/1978 | Owen, III et al. | 365/227 |
| 4,284,958 | 8/1981 | Pryor et al. | 330/253 |
| 4,284,959 | 8/1981 | Heagerty et al. | 330/253 |
| 4,658,160 | 4/1987 | Young | 307/530 |

Primary Examiner—James W. Moffitt
Attorney, Agent, or Firm—Blakely, Sokoloff, Taylor & Zafman

[57] ABSTRACT

A folded cascode configured current steering decoder circuit for coupling a column of memory cells of a static random access memory for reading by a sense amplifier. A pair of cascode configured p-channel transistors turn on to couple memory bit lines to output lines so that the sense amplifier can provide the reading of contents of the selected memory cell. A second pair of p-channel transistors are each coupled to each of the bit lines for providing a steady state current source when the first pair of transistors are turned on for transferring information from the bit line to the output line pairs. The cascode configured transistors are MOSFET switches which are biased to cause a current inbalance when data from the memory cell are placed on the bit lines. The inbalanced current passing through the cascoded transistor pairs causes a current difference which can then sensed by a low input impedence sense amplifier. The cascoded MOSFETS provide for an isolation of the bit line capacitance from the output line capacitance to reduce the amount of time required for transferring information from the bit line to the sense amplifier.

16 Claims, 4 Drawing Sheets

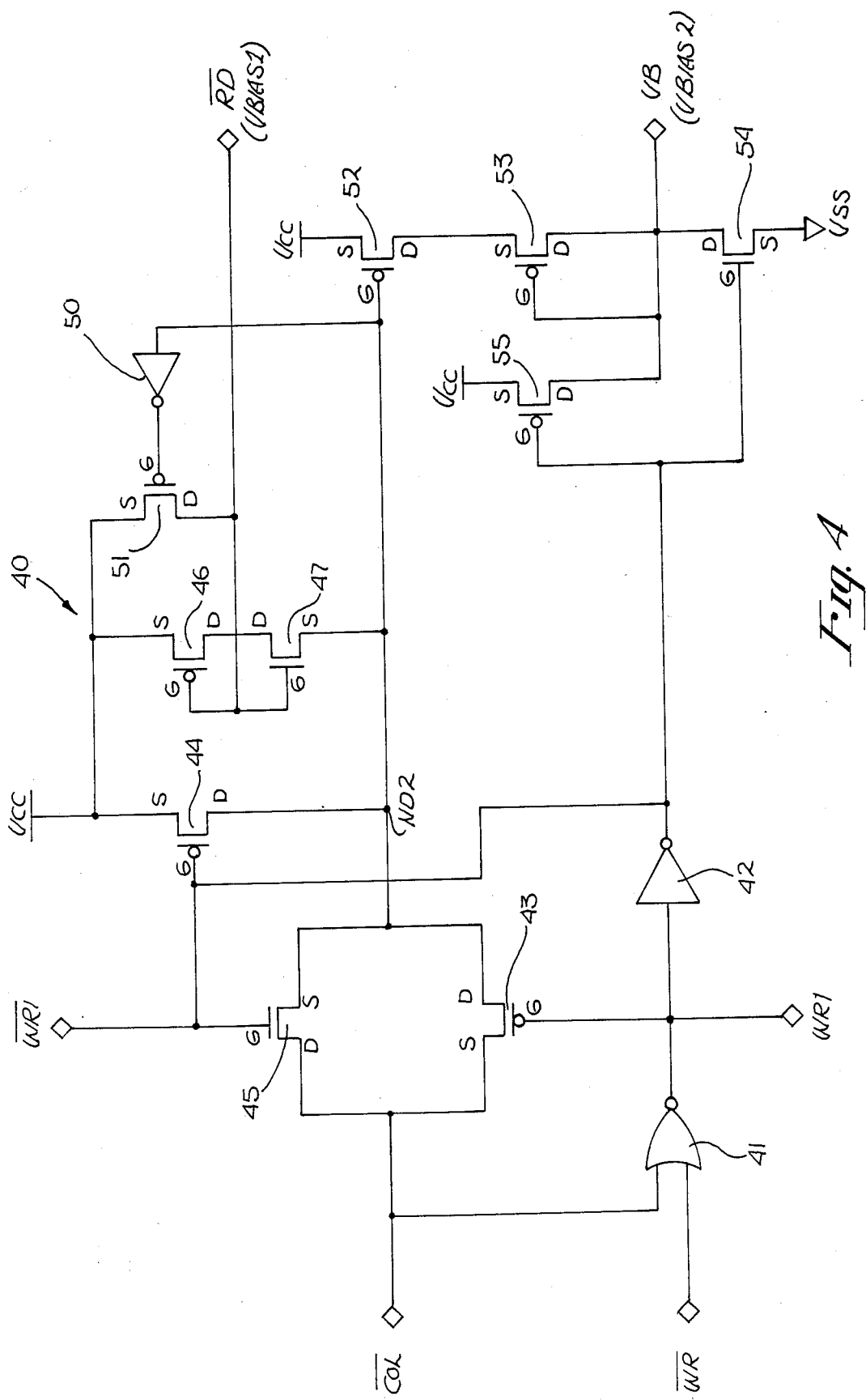
Fig. A

| 39 | WRITE COL. SELECTED $\overline{WR} = VSS$ | READ COLUMN NOT SELECTED $\overline{COL} = VCC$ | READ COLUMN SELECTED $\overline{COL} = VSS$ |
|---|---|---|---|
| $\overline{WR1}$ | VSS | VCC | VCC |
| WR1 | VCC | VSS | VSS |
| $\overline{RD}$ | VCC | VCC | BIASED (VBIAS1) |
| VB | VCC | VSS | BIASED (VBIAS2) |
| ND2 | VCC | VCC | VSS |

*Fig. 3*

FOLDED-CASCODE CONFIGURED DIFFERENTIAL CURRENT STEERING COLUMN DECODER CIRCUIT

BACKGROUND OF THE INVENTION

1. Field of the Invention

The present invention relates to the field of semiconductor memory devices, and more particularly to memory decoder circuits.

2. Prior Art

In a typical semiconductor memory, contents of the memory are couple to other devices through various interfacing means. Well-known architecture developed for semiconductor memories incorporate the use of sensing amplifiers to read the information stored in various memory cells. Data is written into and stored in a memory cell, and when this data is to be read from each of these memory cells, a pair of bit lines couple the memory cell to its appropriate sensing amplifier. The sensing amplifier reads the state of the bit lines and provides the results as an amplified signal on a distribution bus. In a typical memory array architecture, a plurality of memory cells are arranged in an array and a column of memory cells are coupled to a sense amplifier through a decoder circuit. A word line selects memory cells of a given row of an array and one of the decoder circuits is selected to couple a desired column to the sense amplifier.

One such prior art architecture uses static random access memory (SRAM) cell. One such SRAM architecture is described in U.S. Pat. No. 4,096,584, entitled LOW POWER/HIGH SPEED STATIC RAM, which is as igned to the assignee of the present application. Generally, the column decoder circuit switches the memory cell bit line pairs onto a pair of output lines for transferring data on the bit lines to the sense amplifier. Further, the pair of bit lines and output lines are comprised of a data line and its compliment line.

In the prior art when bit lines are coupled to the output lines, bit line and output line capacitances are shorted together when its respective column decode circuit is selected. Current coupling the data from the SRAM cell will need to move the total capacitance of the bit line and the output line in order to develop a signal for sensing by the sense amplifier. If the bit line capacitance and the output line capacitance are isolated from each oteer, then a signal current of the memory cell would need to drive less capacitance to develop a signal on the output lines for the sense amplifier and decrease the time required to transfer the data from the memory cell to the sense amplifier.

Further, in some prior art decoding circuits using metal-oxide semiconductor field-effect transistor (MOSFET) switches, a resistance is introduced by the presense of these MOSFETs. The MOSFET resistance combines serially with the output line capacitance, therein causing an introduction of a RC time constant which further delays the transfer of the signal from the bit line pair to the output line pair. The delay caused by the RC time constant occurs, because in the prior art SRAM decoder circuits the bit lines are typically driven by a voltage source and the output lines are coupled to a high input impedence sense amplifier.

In addition, prior art SRAM cells utilizing no capacitative isolation between the bit line and the output line pairs are sensitive to power supply variations. For example, when the power supply voltage ramps quickly from its operating value, the bit lines are left at their original voltage level because of a lack of a discharge path for the bit lines. Therefore, prior art SRAM cells are more sensitive to supply voltage variations and can provide erroneous readings if operating in an unstable environment.

Finally, older techniques have used high input impedance differential sense amplifier with level shifting that does not provide as fast a response as a low input impedance sensing amplifier, because the high input impedence devices are typically voltage driven and the overall amplifier requires mor stages of amplification.

It is appreciated then that what is required is a SRAM decoding circuit which is capable of isolating the bit line capacitance from the output line capacitance; and is further capable of driving a low input impedance sensing amplifier, as well as providing a circuit which is generally immune from sudden power supply voltage variations.

SUMMARY OF THE INVENTION

The present invention provides for a decoder circuit which provides for faster sensing of the signal current from a SRAM cell. The decoder circuit of the present invention transfers the signal from the bit line pairs to the output line pairs while isolating the bit line capacitance from the output line capacitance to reduce the total capacitance which must be driven for transfer of information from the SRAM to a sense amplifier. The isolation of the bit line capacitance from the output line capacitance results in a decrease in the time required for transferring data from the memory to the sense amplifier.

The decoder circuit is comprised of a pair of current sourcing transistors, each coupled to each of the bit lines for providing a steady current source. A second pair of transistors is arranged in a cascode configuration and are switched on to couple the data from the bit line pairs to the output line pairs. Prior to hhe reading of data from the memory, each current sourcing transistor is initialized to provide a steady state current which flow from the current source onto the bit line, through the cascode configured transistor, onto the output line and to the sense amplifier. Both the bit line and the bit line compliment are coupled in this fashion to provide a differential input to the sense amplifier.

The cascode configured transistors are MOSFET switches which are biased to be sensitive to a current inbalance when data from the memory cell is placed on the bit lines. When the memory is activated for reading information from a memory cell, the data in the memory cell causes the cell to sink current from the respective bit line pull-up p-channel current sourcing transistor. The inbalanced current passes through the cascoded transistor pairs and causes a current difference along the data output lines, which is then sensed by the sense amplifier. The inbalanced current, therefore, causes the cascoded transistor pair to transfer a current inbalance from the bit-lines to the data output lines for sensing by the sense amplifier. The cascoded MOSFETs provide for an isolation of the bit line capacitance from the output line capacitance to reduce the amount of time required for transferring information from the bit lines to the sense amplifier.

BRIEF DESCRIPTION OF THE DRAWINGS

FIG. 3 is a table showing various signal states used by the circuit of FIG. 2.

FIG. 4 is a schematic diagram showing the generation of various signals used by the circuit of FIG. 2.

DETAILED DESCRIPTION OF THE INVENTION

The present invention provides for a decoding circuit as used with a SRAM memory cell. In the following description, numerous specific details are set forth such as specific circuits, memory cells, etc., in order to provide a thorough understanding of the present invention. It will be obvious, however, to one skilled in the art that the present invention may be practiced without these specific details. In other instances, well-known circuits and control lines have not been described in detail in order not to unnecessarily obscure the present invention.

PRIOR ART

Figure 1:
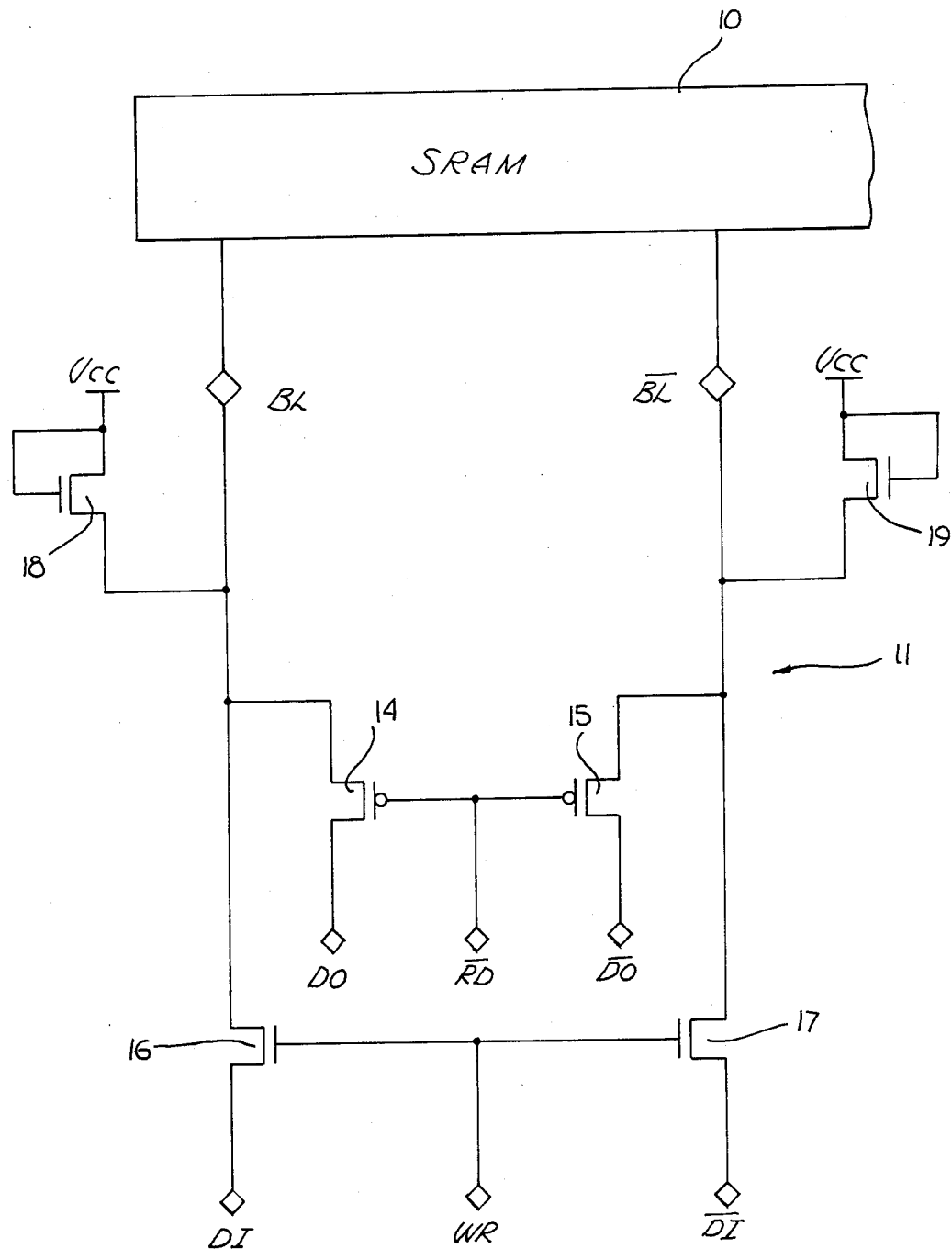
FIG. 1 is a schematic diagram showing a prior art decoding circuit implemented with a SRAM memory cell.

Referring to FIG. 1, a SRAM 10 is shown having a pair of bit lines designated BL and $\overline{BL}$ (BL compliment). The bit lines BL and $\overline{BL}$ are utilized to couple data from a column of cells to decoder 11. Decoder 11 is comprised of switches 14 through 17. This particular decoder 11 of FIG. 1 is shown having n-channel MOSFET switches 16 and 17 and p-channel MOSFET switches 14 and 15, although in practice, a variety of switching devices and combinations can be utilized to perform the functions of switches 14 through 17 of FIG. 1.

Switches 16 and 17 are utilized to couple data from data input lines DI and $\overline{DI}$ onto bit lines BL and $\overline{BL}$. A write signal WR is coupled to gatesoof switches 16 and 17, such that during a write operation signal WR activates switches 16 and 17. Data is coupled from line DI through switch 16 onto bit line BL and line $\overline{DI}$ is coupled through switch 17 onto bit line $\overline{BL}$. Therefore, during a write operation switches 16 and 17 permit the coupling of data from data input lines DI and $\overline{DI}$ onto bit lines BL and $\overline{BL}$, respectively, for writing data into memory cells of SRAM 10. During a write operation switches 14 and 15 are in an open state. Transistors 18 and 19 are coupled to its respective bit line for providing load devices for bit lines BL and $\overline{BL}$.

Conversely during a read operation, switches 16 and 17 are open and switches 14 and 15 are closed due to a read signal $\overline{RD}$ on gates of switches 14 and 15. Read signal $\overline{RD}$ activates switches 14 and 15 such that bit line BL is coupled to data output line DO and bit line $\overline{BL}$ is coupled to data output line $\overline{DO}$ through switch 15. The pair of p-channel MOSFET switches 14 and 15 are activated during a read operation, wherein BL and $\overline{BL}$ are coupled to DO and $\overline{DO}$, respectively. The bit line pairs are voltage driven and causes bit line capacitance and output line capacitance to be shorted together to form a combined capacitive load to the development of the data signal on the data output line pair.

Further, MOSFET switches 14 and 15 introduce additional resistance in series with the output line capacitance which results in the combination of the two to form a RC circuit. The additional RC time constant introduced requires additional time for the transfer of the voltage signal from the bit line pair to the output line pair. Also, SRAM cell 10, having n-channel bit line loads 18 and 19, cause the bit lines to be voltage driven and in the prior art use a high input impedance differential amplifier requiring level shifting to sense the state of the signal on the output line pairs. Typically, this high input impedance differential amplifier is slower in operation than a low input impedance sense amplifier.

Further, the n-channel enhancement loads 18 and 19 which operate as pull-up devices on the bit lines are affected by power supply voltage ramp-downs. When the power supply voltage variation causes a quick ramp-down, the bit lines are left at their original supply voltage levels and cannot discharge due to the n-channel loads 18 and 19 being turned off by the lower power supply voltage.

PREFERRED EMBODIMENT

Figure 2:
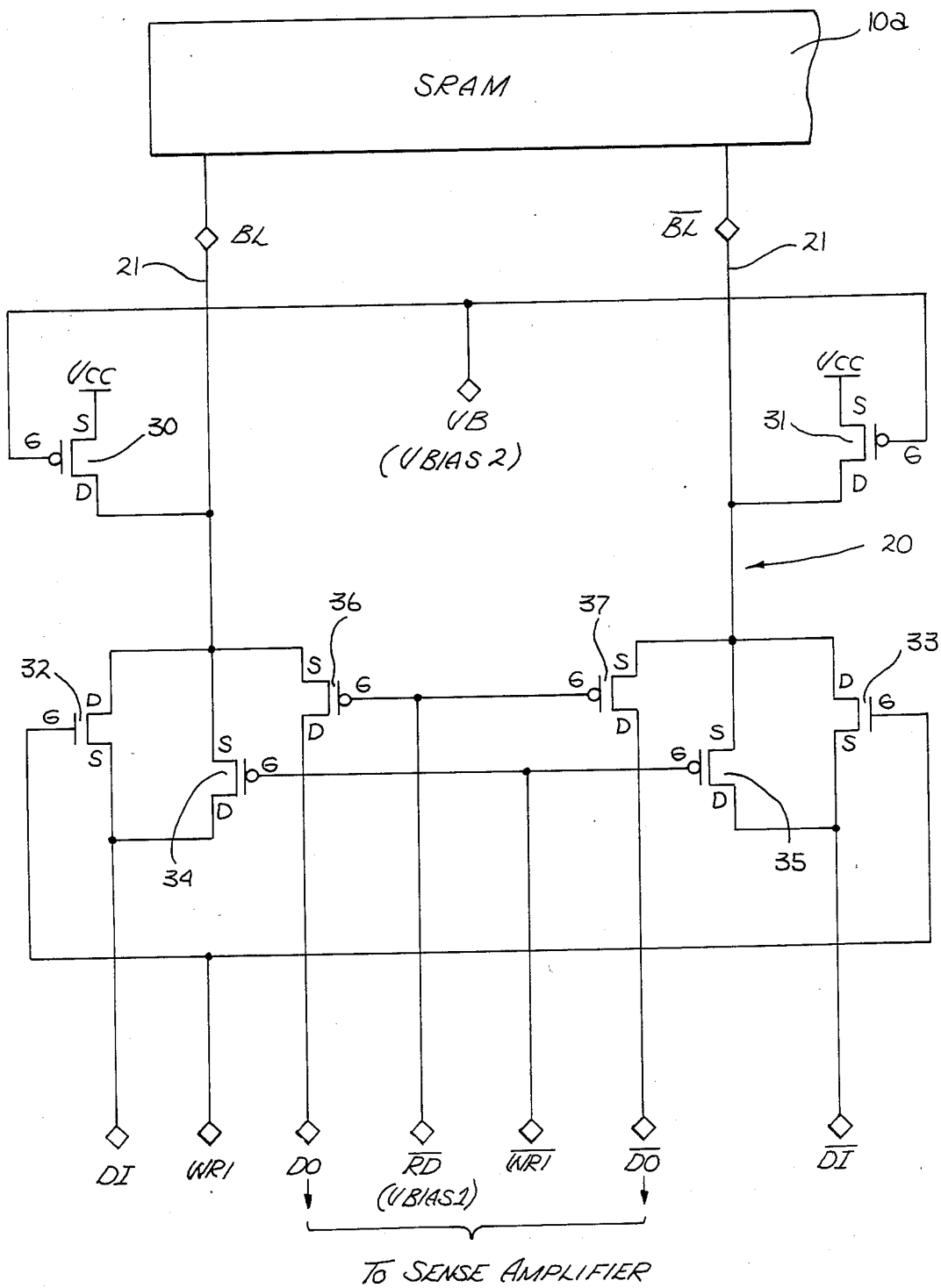
FIG. 2 is a schematic diagram of a decoding circuit of the present invention as utilized with a SRAM memory cell.

Referring to FIG. 2, a decoder circuit 20 which is a preferred embodiment of the present invention is shown. Decoder 20 is shown having a bit line 21 (BL) and bit line 22 ($\overline{BL}$) coupled to a SRAM 10a which is equivalent to the SRAM 10 of FIG. 1. Bit lines 21 and 22 are coupled to a column of memory cells of SRAM 10a which are arranged in an array, although other memory structures can function with decoder 20. One such SRAM device is described in U.S. Pat. No. 4,096,584.

A generation of a signal from the SRAM 10a onto bit lines 21 and 22 is achieved by the selected cell providing a current source which pulls down on one of the bit lines 21 or 22 depending on the data stored within the cell of SRAM 10a. In this particular embodiment, if a 1 is stored in the cell, then the current source within the cell sinks current to a low voltage state (Vss) on bit line 22. If the data stored is a zero, then the current source in the cell sinks current to Vss from bit line 21 causing bit line 21 to go to a low voltage state. Decoder 20 is comprised of MOSFET switches 30–37, wherein switches 30, 32, 34 and 36 are coupled to bit line 21 and switches 31, 33, 35 and 37 are coupled to bit line 22. In this preferred embodiment switches 30, 31, 34–37 are p-channel MOSFET devices and switches 32 and 33 are n-channel MOSFET devices. Switches 30 and 31 have their drains coupled to bit line 21 and 22, respectively, and their sources coupled to a supply voltage (Vcc). The gates of switches 30 and 31 are coupled together to receive a voltage bias signal VB. Switches 30 and 31 operate as bit line active load devices to pull-up its respective bit lines to Vcc.

Switches 32–35 are utilized to pass data present on data input lines DI and $\overline{DI}$ onto bit lines 21 and 22 during a write operation. The source of switch 32 and the drain of switch 34 are coupled to the data input line DI for receiving input signals, and the drain of switch 32 and the source of switch 34 are coupled to bit line 21. Alternatively, the source of switch 33 and the drain of switch 35 are coupled to the data input line compliment $\overline{DI}$ to accept data compliment signal, and the drain of switch 33 and the source of switch 35 are coupled to bit line 22. Gates of switches 32 and 33 are coupled together for receiving a write command WR1. Gates of switches 34 and 35 are coupled together to accept a compliment write command $\overline{WR1}$.

The read switches 36 and 37 are activated to transfer data on bit lines 21 and 22 onto data output lines DO and $\overline{DO}$, respectively. The source of switch 36 is coupled to bit line 21 and the drain of switch 36 is coupled to DO. Alternatively, the source of switch 37 is coupled to bit line 22 and the drain of switch 37 is coupled $\overline{DO}$. The gates of switches 36 and 37 are coupled together to accept a read command $\overline{RD}$ for the activation of switches 36 and 37.

The operation of decoder 20 can be understood more easily if the truth table shown in FIG. 3 is used in conjunction with the functional description of FIG. 2. During a write operation data is present on input data lines DI and $\overline{DI}$ for transfer onto bit lines 21 and 22, respectively. Signal VB is at Vcc causing devices 30 and 31 to be turned off and disconect Vcc from the bit lines 21 and 22. To transfer the data onto the bit lines during a write operation, devices 32 and 33 are activated by the WR1 signal and switches 34 and 35 are turned on by the $\overline{WR1}$ signal. These two write signals will turn on switches 32-35 permitting data to be transferred from data lines DI and $\overline{DI}$ onto bit lines 21 and 22. Devices 32 and 34 are in parallel, as are device pairs 33 and 35, to reduce the voltage drop across the devices when writing a high level onto the bit lines. During the write operation, switches 36 and 37 are open due to Vcc being present on gates of switches 36 and 37.

During a read operation, signal $\overline{WR1}$ goes to Vcc and write signal WR1 goes to Vss, wherein switches 32-35 are turned off to decouple data lines DI and $\overline{DI}$ from bit lines 21 and 22. When a given column, such as the column operated on by decoder 20, is not selected during a read operation, the read signal $\overline{RD}$ remains at Vcc, however, signal VB goes to Vss activating switches 30 and 31. The activation of devices 30 and 31 places Vcc onto bit lines 21 and 22. The bit lines are initialized to an equalized ready state in the event this particular column is selected for reading. In this instance, devices 30 and 31 function as "pull-up" load devices for bit lines 21 and 22, respectively.

When a particular column associated with decoder 20 is then selected during a read operation, data is transferred from SRAM 10a to a sense amplifier (not shown) coupled to output lines DO and $\overline{DO}$. Signals VB and RD transition to an intermediate voltage level (Biased level) designated $V_{BIAS1}$ and $V_{BIAS2}$, respectively. The biased level voltages $V_{BIAS1}$ and $V_{BIAS2}$ control the amount of turn-on of devices 30 and 31, 36 and 37, respectively. Devices 30 and 31 are biased to operate as current sources which provide a steady source of current. Switches 36 and 37 turn on to also operate in a biased region. Devices 36 and 37 are arranged in a cascode configuration to permit the transfer of information from bit lines 21 and 22 onto DO and $\overline{DO}$. The cascode configuration biases devices 36 and 37 in the saturation region, thus the output line capacitance is isolated from bit line capacitance for signal loading.

When this particular column is selected, the voltage level of the bit line pairs 21-22 are determined by $V_{BIAS1}$ and the gate to source voltage, Vgs of switches 36 and 37. The gates of devices 30 and 31 are at a biased voltage level $V_{BIAS2}$. The bit lines 21 and 22 are no longer at Vcc and transition to an intermediate level determined by the value of Vgs of the p-channel switches 36 and 37 and their gate bias $V_{BIAS1}$. For optimum signal development the bit lines 21 and 22 need to be at a voltage value of less than or equal to Vcc−(Vgs−Vtp) for devices 30 and 31. In this case the biased operation of p-channel bit line pull-up devices 30 and 31 causes them to operate in their saturated state and they function as current sources coupled to bit lines 21 and 22. It is appreciated that devices 30 and 31 can be made to operate in a linear region to provide an equivalent current source.

Further, because the sense amplifier is coupled to output lines DO and $\overline{DO}$, the sense amplifier operates to sink current from devices 30 and 31. Therefore, in a DC state, (ignoring the data present in SRAM 10a) a steady state current is caused to flow through device 30 onto bit line 21, through switch 36 and onto output line DO as one input to the sense amplifier. Alternatively, device 31 operates as a steady state DC current source causing current to flow onto bit line 22, through switch 37 and onto output line $\overline{DO}$ as the compliment input to the sense amplifier. A two input differential sense amplifier provides the current source devices 30 and 31 a path to Vss for completing the steady state DC current biasing path from Vcc. One such differential sense amplifier utilizing a differential common gate input MOS sense amplifier is described in U.S. Pat. No. 4,658,160, issued to the same inventor as the inventor of the present application. It is to be noted that the specific circuit configuration of U.S. Pat. No. 4,658,160 would require inputs having n-channel devices.

When a word line of SRAM 10a turns on a cell coupled to bit lines 21 and 22, a signal is introduced onto bit lines 21 and 22 (a non-DC state). Depending on the information stored in the cell one of the bit lines 21 or 22 will sink current. The signal current source of SRAM 10a operates as a bypass or a sink for the current of device 30 or 31 flowing through switches 36 and 37. That is, when the SRAM memory cell is activated, it causes an unbalanced current condition in bit lines 21 and 22, which in effect is transferred to the current of output lines DO and $\overline{DO}$ and sensed by the sense amplifier. The reduced current in one of bit lines 21 or 22 will cause the Vgs of the respective switch 36 or 37 to be reduced. Further, because the gates of switches 36 and 37 are at a common bias voltage $V_{BIAS1}$, the reduction in Vgs of one of the switches 36 or 37 will cause its respective bit line to be lower in potential.

While a difference in current has been propagated from SRAM 10a onto the output lines DO and $\overline{DO}$ by current "steering" through the folded cascode configuration of switches 36 and 37, a differential voltage does appear on the bit lines 21 and 22 due to the finite transconductance of the MOSFET devices 36 and 37. It is to be noted that if switches 36 and 37 were PNP bi-polar transistors, the differential voltage would be less than the MOSFET implementation because the bi-polar transistors have a higher transconductance for an equal amount of silicon area used.

The above described "current steering" technique is performed by p-channel switches 36 and 37 operating in the cascode configuration. Since switches 36 and 37 are biased in the saturation region, the bit line capacitance of bit lines 21 and 22 are isolated from the output line capacitance, permitting the full differential signal current to seperately drive the bit line capacitance and the output line capacitance isolating the two capacitance. By implementing the "current steering" technique of the present invention, the bit line capacitance is isolated from the output line capacitance, which permits a faster transfer of data signal from SRAM 10a onto output lines DO and $\overline{DO}$ for sensing by the sense amplifier.

The "current steering" technique is optimally suited for operation with a low input impedance current sensing differential amplifier having a common gate configuration to fully take advantage of the high speed sensing application. Whereas the prior art device of FIG. 1 transfers voltage from the bit lines to the I-O lines, the "current steering" technique of the present invention achieves data transfer by causing current to be "steered" from the bit line pairs to the output line pairs.

It is appreciated that various circuit devices and configurations are available to perform the "current steering" of the present invention without departing from the spirit and scope of the present invention. Further in most instances, the input and output lines DI and DO, as well as $\overline{DI}$ and $\overline{DO}$, are coupled together to a common input/output line pairs.

Although various tecniques are available to generate the necessary signals for the operation of the decoder circuit of FIG. 2, the preferred embodiment uses the circuit of FIG. 4 to generate these various signals. Referring to FIG. 4, the circuit 40 is comprised of an NOR gate 41 having two inputs, one coupled to column select signal $\overline{COL}$ and the other input coupled to write signal $\overline{WR}$. The WR1 signal is coupled from the output of NOR gate 41 and the output of NOR gate 41 is also coupled to inverter 42 and to the gate of p-channel transistor 43. The $\overline{WR1}$ signal is taken from the output of inverter 42, and the output of inverter 42 is coupled to the gate of p-channel transistor 44 and the gate of n-channel transistor 45. $\overline{COL}$ is coupled through transistors 43 and 45 and onto a node designated ND2. A p-channel transistor 44 is coupled between Vcc and ND2, and p-channel transistor 46 and n-channel transistor 47 are coupled in series between Vcc and ND2. The gates and drains of transistors 46 and 47 are coupled together and the signal $\overline{RD}$ is generated from this interconnection.

Inverter 50 is coupled having its input coupled to node ND2 and its output coupled to the gate of p-channel transistor 51. The source and drain of transistor 51 is coupled between Vcc and the interconnection of devices 46 and 47 generating signal $\overline{RD}$. P-channel transistors 52 and 53 and n-channel transistor 54 are coupled in series between Vcc and Vss. The gate of transistor 52 is coupled to node ND2, and the gate and the drain of transistor 53 are coupled to the drain of transistor 54, wherein this interconnection generates the bias voltage VB. Source of transistor 53 is coupled to the drain of transistor 52 and the drain of transistor 55 is also coupled the interconnection of VB. A p-channel transistor 55 is coupled between Vcc and the interconnection generating the bias voltage VB. The gates of transistors 54 and 55 are coupled together to the output of inverter 42.

In operation, if the column is selected during a write cycle, signal $\overline{WR}$ and $\overline{COL}$ are low (Vss), causing WR1 to be high (Vcc) and $\overline{WR1}$ to be low, which permits data to be written into SRAM 10a of FIG. 2. Also during a write operation the low state present on the gate of transistor 44 turns on transistor 44 thereby placing ND2 to Vcc. The low state at the output of inverter 42 activates transistor 55 causing VB to be at Vcc. Also the high state of node ND2 causes gate of transistor 51 to turn on due to the inversion by interver 50, wherein $\overline{RD}$ is at Vcc.

During a read operation, signal $\overline{WR}$ goes high such that transistor 54 is activated causing VB to be at Vss. Transistors 43 and 45 conduct causing signal $\overline{COL}$ to be passed onto node ND2. When the column has not been selected, the COL signal is at Vcc. The high state of node ND2 is passed onto the gate of transistor 51, such that $\overline{RD}$ is at Vcc. When the column is selected, $\overline{COL}$ goes low causing node ND2 to go low also. The low state of node ND2 turns off transistor 51, such that the voltage potential of $\overline{RD}$ is determined by the conductance of transistors 46 and 47. The biasing voltage $V_{BIAS1}$ of $\overline{RD}$ is determined by the impedance ratio generated by p-channel transistor 46 and n-channel transistor 47, wherein $V_{BIAS1}$ is determined by the voltage division performed by transistors 46 and 47.

Further, $V_{BIAS2}$ is generated by the voltage division performed by transistors 53 and 54. Transistor 52 is turned on fully at this time and its voltage Vds is negligible in value. $V_{BIAS2}$ is determined by Vcc minus Vtp of transistor 53 minus the turn-on voltage of transistor 53, which is Vgs minus Vtp. Therefore, $V_{BIAS2}$ is determined by Vcc-Vgs53. The gate of transistors 30 and 31 of FIG. 2 are coupled to the gate and drain of transistor 53 of FIG. 4, such that the combination of transistors 53 and 30, as well as transistors 53 and 31, are configured to operate as current mirrors. Advantages of using a current mirror are well-known in the art.

Further $V_{BIAS1}$ is generated by voltage division of transistors 46 and 47. $V_{BIAS1}$ has a value which biases transistors 30 and 31 in the saturation region. Also in conjunction with the sense amplifier which biases the drains of transistors 36 and 37 through the output lines, $V_{BIAS1}$ biases transistors 36 and 37 in the saturation region and the cascode configuration.

By utilizing the two bias voltages, any variations in Vcc are reflected also in $V_{BIAS1}$ and $V_{BIAS2}$, wherein variations in the supply voltage have appreciably little effect on the operation of the current sources 30 and 31 of FIG. 2. Thus, a differential current steering column decoder circuit has been described.

I claim:

1. A decoder circuit for coupling data stored in a memory to a sensing device, comprising:
    a pair of data lines for coupling said stored data from said memory;
    a pair of output lines for coupling said stored data to said sensing device;
    a first pair of transistors arranged in a cascode configuration and for switching said stored data from said data lines onto said output lines;
    a second pair of transistors each coupled to one of said pairs of data lines for sourcing current when said first pair of transistors are activated, wherein when said stored information is coupled onto said data lines from said memory, said data lines cause a current imbalance through said first pair of transistors;
    whereby said stored data is coupled to said sensing device.

2. The decoder circuit of claim 1, wherein gates of said second pair of transistors are coupled together and are biased by a reference voltage having a voltage level which is between a supply voltage level and its return.

3. The decoder circuit of claim 2, wherein said first pair of transistors are p-channel devices.

4. The decoder circuit of claim 3, wherein said second pair of transistors are p-channel devices.

5. The decoder circuit of claim 4, wherein said first pair of transistors are biased by a second reference voltage having a second voltage level which is between said supply voltage level and its return.

6. The decoder circuit of claim 2, wherein said memory is comprised of a plurality of cells arranged in a column and said decoder circuit provides decoding for said column.

7. The decoder circuit of claim 5, wherein said memory is comprised of a plurality of cells arranged in a column and said decoder circuit provides decoding for said column.

8. A decoder circuit for coupling data stored in a random access memory (RAM) to a sense amplifier comprising:

a first pair of data lines for coupling said stored data from said RAM, said first pair of data lines comprised of a bit line and its complement bit line;

a second pair of data lines for coupling said stored data to said sense amplifier, said second pair of data lines comprised of an output line and its complement output line;

a first pair of transistors for switching said stored data from said first pair of data lines onto said second pair of data lines, one of said first pair of transistors coupling said bit line to said output line and the other of said first pair of transistors coupling said compliment bit line to said complement output line;

a second pair of transistors, one coupled to said bit line and the other coupled to said complement bit line, said second pair of transistors for sourcing current when said first pair of transistors are switched on, wherein when said stored data is coupled onto said first pair of data lines from said RAM, a current imbalance through said first pair of transistors is serially coupled to said second pair of data lines and detected by said sense amplifier;

said first pair of transistors isolating bit line capacitance from output line capacitance and complement bit line capacitance from complement output line capacitance to provide a faster transfer of said stored data from said bit lines to said output lines;

whereby a rapid reading of said stored data is achieved.

9. The decoder circuit of claim 8, wherein gates of said second pair of transistors are coupled together and are biased by a reference voltage having a voltage level which is between a supply voltage level and its return.

10. The decoder circuit of claim 9, wherein said the first pair of transistors are p-channel devices.

11. The decoder circuit of claim 10, wherein said second pair of transistors are p-channel devices.

12. The decoder circuit of claim 11, wherein said first pair of transistors are biased by a second reference voltage having a second voltage level which is between said supply voltage level and its return.

13. The decoder circuit of claim 12, wherein said RAM is comprised of a plurality of cells arranged in a column and said decoder circuit provides decoding for said column.

14. The decoder circuit of claim 13, wherein said RAM is a static RAM.

15. The decoder circuit of claim 8, wherein said RAM is a static RAM.

16. The decoder circuit of claim 14, further including a set of input switching transistors coupled to said bit lines for coupling data into said memory.

* * * * *